United States Patent
Fredriksen

(10) Patent No.: US 7,944,384 B2
(45) Date of Patent: May 17, 2011

(54) DEVICE AND METHOD FOR SCANNING MULTIPLE ADC CHANNELS

(75) Inventor: Einar Fredriksen, Trondheim (NO)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/542,545

(22) Filed: Aug. 17, 2009

(65) Prior Publication Data

US 2011/0037634 A1 Feb. 17, 2011

(51) Int. Cl.
*H03M 1/00* (2006.01)
(52) U.S. Cl. .......................... 341/141; 341/155
(58) Field of Classification Search .................. 341/155, 341/141
See application file for complete search history.

(56) References Cited

U.S. PATENT DOCUMENTS

| | | | | |
|---|---|---|---|---|
| 5,212,483 | A * | 5/1993 | Wakimoto | 341/141 |
| 7,235,999 | B2 * | 6/2007 | Goetting et al. | 326/9 |
| 7,477,174 | B2 * | 1/2009 | Onde | 341/111 |

* cited by examiner

*Primary Examiner* — Brian Young
(74) *Attorney, Agent, or Firm* — Baker Botts L.L.P.

(57) ABSTRACT

An analog to digital converter has an input for coupling to multiple channels having analog signals. The analog to digital converter converts the analog signals on such channels to provide a digital output. A memory device has an enable bit for each of the multiple channels and a current channel register. An interface coupled to the memory device and current channel register selects a next channel for converting by the analog to digital converter, skipping channels that are not enabled.

7 Claims, 2 Drawing Sheets

DEVICE AND METHOD FOR SCANNING MULTIPLE ADC CHANNELS

BACKGROUND

Analog to digital converters (ADCs) may be used to convert analog signals from multiple channels to digital signals. Signals from each of the channels may be converted in rapid succession. When some channels are not enabled, the results from such channels may be discarded. In some prior devices, a signal from one channel is converted, and software is used to determine which channel to handle next. Execution of the software results in additional overhead to select a channel when an arbitrary number of channels are enabled.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software or a combination of software and human implemented procedures in one embodiment. The software may consist of computer executable instructions stored on computer readable media such as memory or other type of storage devices. Further, such functions correspond to modules, which are software, hardware, firmware or any combination thereof. Multiple functions may be performed in one or more modules as desired, and the embodiments described are merely examples. The software may be executed on a digital signal processor, microcontroller, ASIC, microprocessor, or other type of processor operating on a computer system, such as a personal computer, server or other computer system.

Various embodiments are described to use an analog to digital converter to scan and efficiently convert analog signals on enabled channels from multiple channels by using a separate enable bit for each channel. When an analog to digital conversion is triggered by a controller, an analog to digital converter interface will convert enabled channels in rapid succession. There may be little or no idle time for channels which are not enabled. When the last enabled channel is reached, the interface identifies a first enabled channel to prepare for a next conversion sequence. The analog to digital converter may be placed in a low power consumption mode to minimize energy consumption if there is a delay between conversion sequences.

Figure 1:
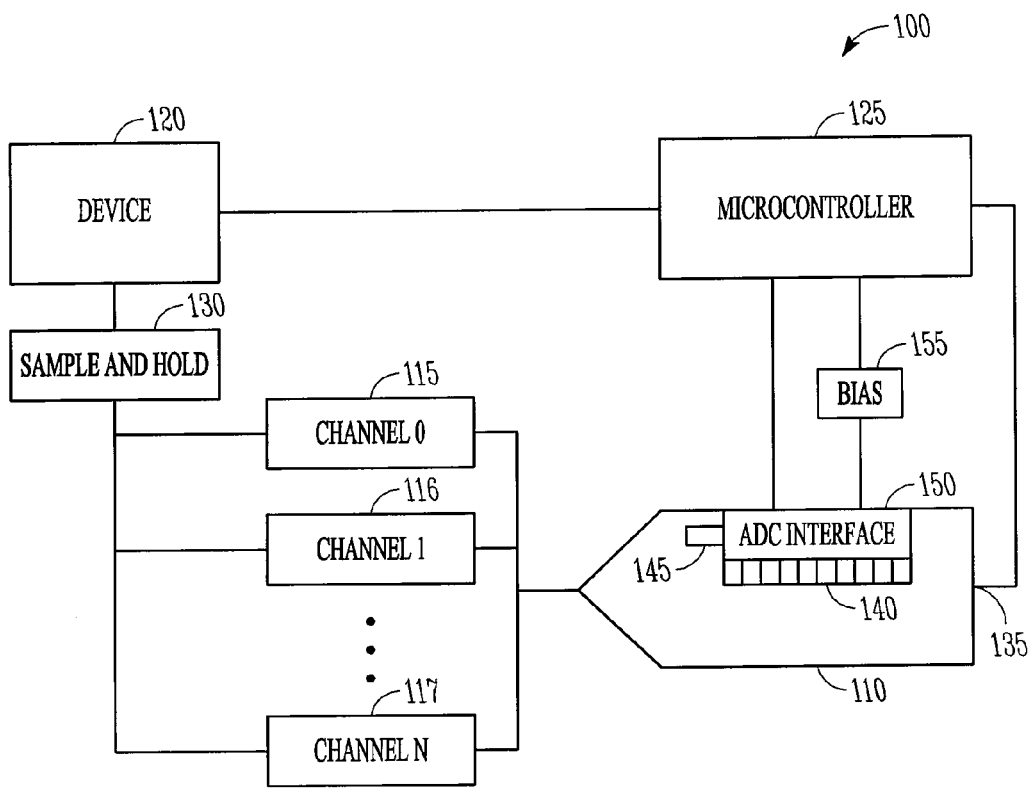
FIG. 1 is a block diagram of an analog to digital converter scanning multiple channels according to an example embodiment.

FIG. 1 is a block diagram of a system 100 including an analog to digital converter 110 for scanning multiple channels indicated at 115, 116, and 117. There may be several more channels in various embodiments. The channels may correspond to signals generated from a device 120. In further embodiments, device 120 may correspond to several devices, such as one device per channel, or a single device with multiple channels. In one embodiment device 120 may be a touchscreen device, or one of many other different types of devices that generate analog signals on multiple channels.

A controller 125 may be used to control device 120 in one embodiment. In one embodiment, the controller 125 may enable only selected channels, or be made aware of a select number of enabled channels from the device 120. Thus, not all the channels will have signals of interest. In one embodiment, controller 125 is a microcontroller.

The analog to digital converter 110 has an input for coupling to the multiple channels 115, 116, 117 and converting analog signals on such channels 115, 116, 117 to provide a digital output 135 that is coupled to the controller 125. The analog to digital converter 110 has a memory device such as a register 140 that has an enable bit for each of the multiple channels 115, 116, 117. A current channel register 145 may used to identify a current channel whose analog signal is being converted. In further embodiments, the current channel may be tracked in software or firmware.

Analog to digital converter 110 also may include or be coupled to an interface 150 coupled to the memory device 140 and current channel register 145 to select a next channel 115, 116, 117 for converting by the analog to digital converter 110. The memory device 140 enable bits identify enabled channels in a current conversion sequence. The interface 150 selects a first enabled channel in a next conversion sequence when a last enabled channel in the conversion sequence is converted. The interface skips channels that are not enabled such that only enabled channels are converted in sequence. The interface 150 waits for triggering of a next conversion sequence when the last enabled channel in the conversion sequence is converted. In one embodiment, the enabled channels correspond to signals from device 120 that are active or enabled. The conversion sequence corresponds to the active or enabled channels of analog signals from the device 120.

In some embodiments, the analog to digital converter 110 is placed in a lower power consumption mode while waiting for triggering of the next conversion sequence following conversion of the last enabled channel in the conversion sequence. The low power consumption mode may be a mode where the analog to digital converter 110 is operating at a low or idle bias current, or may correspond to the analog to digital converter 110 being turned off. Upon triggering of the next conversion sequence, the analog to digital converter 110 is turned back on such that it is in an operating area to enable conversion of signals on enabled channels.

In one embodiment, system 100 may include one or more sample and hold circuits 130 to sample analog signals generated by device 120 and hold them for processing by the analog to digital converter 110. In further embodiments, such circuits 130 may be separate from each other, and may also be multiplexed between the analog signals generated by device 120. The controller 125 may provide enable bits corresponding to a next conversion sequence when it triggers or receives information identifying selected channels which will have signals to be converted from the device 120.

In one embodiment, the controller 125 places the analog to digital converter 110 in a low power state following conversion of the last channel until a new conversion sequence is triggered. The controller 125 may control a bias current module 155 to provide appropriate bias currents for the desired power modes.

Figure 2:
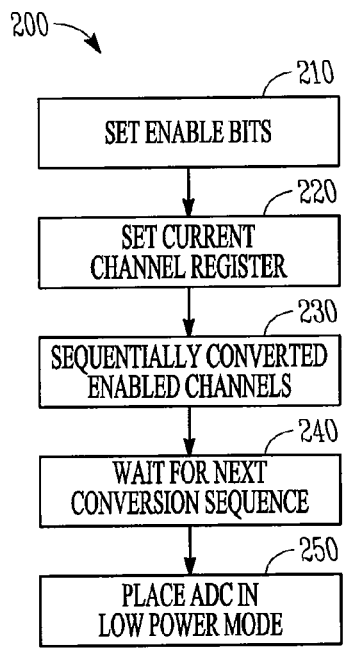
FIG. 2 is a flowchart illustrating a method of selecting channels for conversion according to an example embodiment.

FIG. 2 is a flowchart illustrating a method 200 of selecting channels for conversion. At 210, enable bits are set in a channel enable register corresponding to enabled channels of a plurality of channels. The enable bits represent a conversion sequence to allow the analog to digital converter to rapidly sequence through enabled channels with little or no idle time between channels. There is also little software intervention, as the controller provides the conversion sequence to the memory 140.

A current channel register is set at 220 to identify a current channel being converted. At 230, channels are selected for sequentially converting analog signals on the enabled channels as a function of the enable bits and the current channel register, while skipping conversion of non-enabled channels. The enable bits may be set corresponding to a current channel conversion sequence. In one embodiment, a first enabled channel in a next channel conversion sequence is converted when a last enabled channel in the current channel conversion sequence is converted.

At 240, the analog to digital converter waits for the next channel conversion sequence to be triggered when the last enabled channel in the current channel conversion sequence is converted. At 250, the analog to digital converter is placed in a lower power consumption mode while waiting for triggering of the next channel conversion sequence following conversion of the last enabled channel in the current channel conversion sequence. The enabled channels may correspond to signals from one or more analog outputs of one or more devices 120, such as active areas of a touchscreen device.

Figure 3:
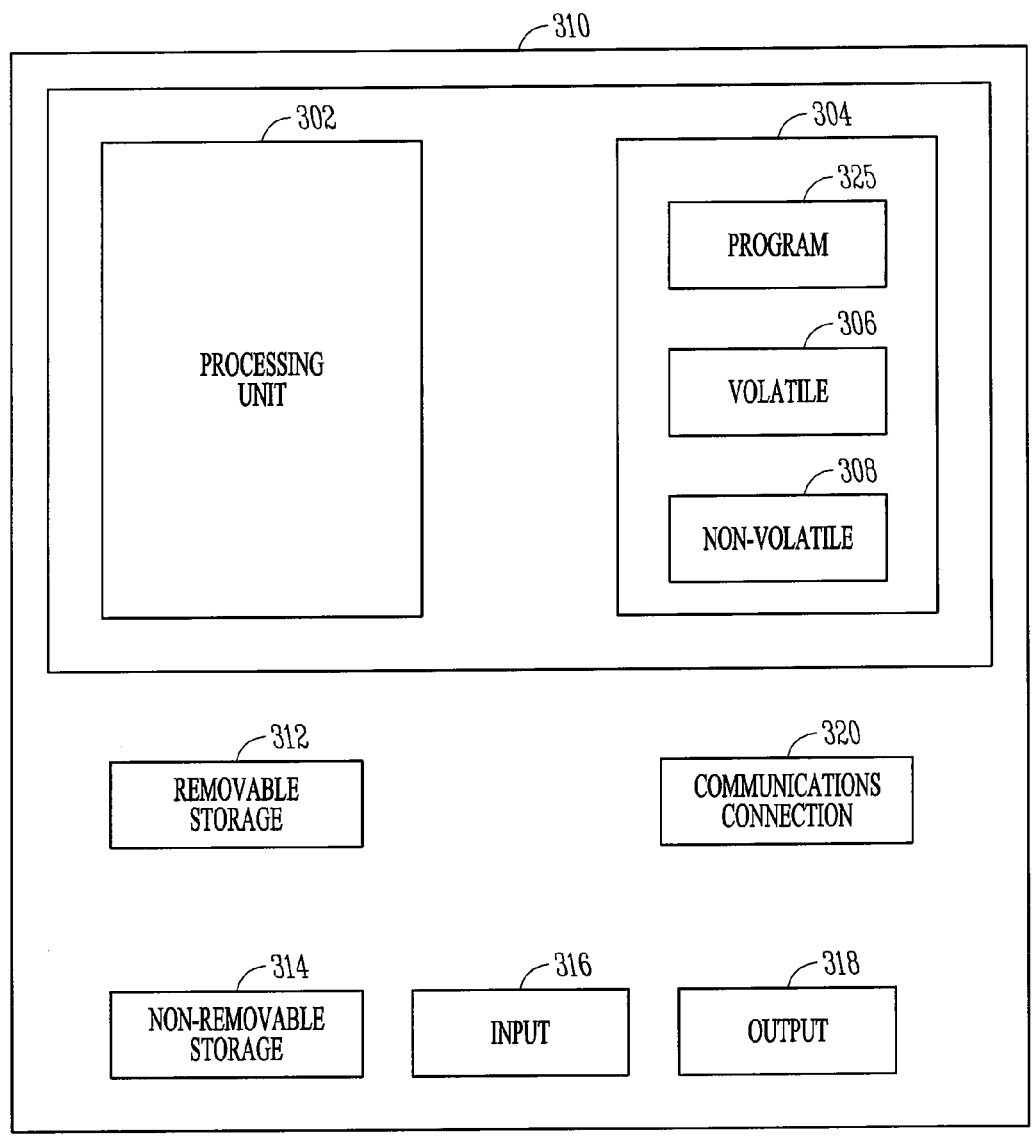
FIG. 3 is a block diagram of a computer system or microcontroller for interfacing with the analog to digital converter of FIG. 1 according to an example embodiment.

FIG. 3 is a block diagram of a computer system or microcontroller for interfacing with the analog to digital converter 110 and providing conversion sequences. A general computing device in the form of a computer 310, may include a processing unit 302, memory 304, removable storage 312, and non-removable storage 314. Microcontroller implementations need not include all the elements of the computer 310, such as the removable storage elements, and may be implemented on a single semiconductor chip. Memory 304 may include volatile memory 306 and non-volatile memory 308. Computer 310 may include—or have access to a computing environment that includes—a variety of computer-readable media, such as volatile memory 306 and non-volatile memory 308, removable storage 312 and non-removable storage 314. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 310 may include or have access to a computing environment that includes input 316, output 318, and a communication connection 320. The computer may operate in a networked environment using a communication connection to connect to one or more remote computers. The remote computer may include a personal computer (PC), server, router, network PC, a peer device or other common network node, or the like. The communication connection may include a Local Area Network (LAN), a Wide Area Network (WAN) or other networks.

Computer-readable instructions stored on a computer-readable medium are executable by the processing unit 302 of the computer 310. A hard drive, CD-ROM, and RAM are some examples of articles including a computer-readable medium.

The invention claimed is:

1. A device comprising:
   an analog to digital converter having an input for coupling to multiple channels having analog signals thereon and converting analog signals on such channels to provide a digital output;
   a memory device having an enable bit for each of the multiple channels;
   a current channel register; and
   an interface coupled to the memory device and current channel register to select a next channel for converting by the analog to digital converter, wherein:
   the memory device enable bits identify enabled channels in a conversion sequence,
   the interface selects a first enabled channel in a next conversion sequence when a last enabled channel in the conversion sequence is converted,
   the interface waits for triggering of the next conversion sequence when the last enabled channel in the conversion sequence is converted, and
   the analog to digital converter is placed in a lower power consumption mode while waiting for triggering of the next conversion sequence following conversion of the last enabled channel in the conversion sequence.

2. The device of claim 1 wherein the interface skips channels that are not enabled such that only enabled channels are converted in sequence.

3. A system comprising:
   an analog to digital converter having an input for coupling to multiple analog signal channels and converting the analog signals on the multiple channels to provide a digital output;
   a memory device having an enable bit for each of the multiple channels;
   a current channel register;
   an interface coupled to the memory device and current channel register to select a next channel for converting by the analog to digital converter; and
   a controller to control the analog device and to provide enable bits corresponding to enabled channels to the memory device wherein the controller places the analog to digital converter in a low power state following conversion of the last channel until a new conversion sequence is triggered.

4. The system of claim 3 wherein the interface selects the next enabled channel as a function of the enable bits in the memory device.

5. The system of claim 3 wherein the controller provides enable bits corresponding to a next conversion sequence when it triggers the analog device to provide analog signals on selected channels.

6. A method comprising:
   setting enable bits in a channel enable register corresponding to enabled channels of a plurality of channels, some of which are not enabled;
   setting a current channel register to identify a current channel being converted;
   sequentially converting analog signals on the enabled channels as a function of the enable bits in the channel enable register and the current channel register while skipping conversion of non-enabled channels, wherein the enable bits are set corresponding to a current channel conversion sequence, and a first enabled channel in a next channel conversion sequence is converted when a last enabled channel in the current channel conversion sequence is converted;

waiting for the next channel conversion sequence to be triggered when the last enabled channel in the current channel conversion sequence is converted; and placing the analog to digital converter in a lower power consumption mode while waiting for triggering of the next channel conversion sequence following conversion of the last enabled channel in the current channel conversion sequence.

7. The method of claim 6 wherein channels that are not enabled are skipped such that only enabled channels are converted in a channel conversion sequence.

* * * * *